US009287260B1

(12) United States Patent
Smith et al.

(10) Patent No.: US 9,287,260 B1
(45) Date of Patent: Mar. 15, 2016

(54) TRANSISTORS HAVING ONE OR MORE DUMMY LINES WITH DIFFERENT COLLECTIVE WIDTHS COUPLED THERETO

(71) Applicant: MICRON TECHNOLOGY, INC., Boise, ID (US)

(72) Inventors: Michael A. Smith, Boise, ID (US); Vladimir Mikhalev, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 14/478,220

(22) Filed: Sep. 5, 2014

(51) Int. Cl.
*H01L 27/088* (2006.01)
*H01L 27/115* (2006.01)
*H01L 23/528* (2006.01)
*H01L 27/02* (2006.01)

(52) U.S. Cl.
CPC ............ *H01L 27/088* (2013.01); *H01L 23/528* (2013.01); *H01L 27/0207* (2013.01); *H01L 27/11526* (2013.01); *H01L 27/11551* (2013.01); *H01L 27/11573* (2013.01); *H01L 27/11578* (2013.01)

(58) Field of Classification Search
CPC .............. G11C 7/04; G11C 7/06; G11C 7/12; G11C 7/14; G11C 11/22; G11C 11/24; G11C 11/34; G11C 19/28; H01L 27/10805; H01L 27/10873
See application file for complete search history.

(56) References Cited

U.S. PATENT DOCUMENTS

| 8,236,640 B2 | 8/2012 | Smith |
| 2002/0141223 A1* | 10/2002 | Kang ..................... G11C 11/22 365/145 |
| 2009/0218638 A1 | 9/2009 | Smith |
| 2012/0037985 A1 | 2/2012 | Smith |
| 2012/0313691 A1 | 12/2012 | Mikhalev et al. |

* cited by examiner

*Primary Examiner* — Kyoung Lee
(74) *Attorney, Agent, or Firm* — Dicke, Billig & Czaja, PLLC

(57) ABSTRACT

In an embodiment, an array of transistors has a first line coupled to a first transistor. The first line extends over a second transistor that is successively adjacent to the first transistor and over a third transistor that is successively adjacent to the second transistor. A second line is coupled to the second transistor and extends over the third transistor. One or more first dummy lines are coupled to the first line and extend from the first transistor to the second transistor. One or more second dummy lines are coupled to the second line and extend from the second transistor to the third transistor. A collective width of the one or more first dummy lines is greater than a collective width of the one or more second dummy lines.

25 Claims, 9 Drawing Sheets

US 9,287,260 B1

TRANSISTORS HAVING ONE OR MORE DUMMY LINES WITH DIFFERENT COLLECTIVE WIDTHS COUPLED THERETO

FIELD

The present disclosure relates generally to transistors, and, in particular, the present disclosure relates to transistors having one or more dummy lines with different collective widths coupled thereto.

BACKGROUND

Transistors, such as field effect transistors (FETs), may be used on the periphery of a memory device. Some of these transistors might be configured to selectively couple access lines (e.g., word lines) to voltage sources, such as high-voltage sources, for supplying voltages to the access-lines. For example, these transistors might be between the voltage sources and respective access lines. Such transistors might be called string drivers, such as access-line (e.g., word-line) drivers, for example. Some such transistors, for example, might have a relatively high source-drain breakdown voltage Bvdss (e.g., above about 15 volts to about 80 volts or greater).

Some memory devices might include stacked memory arrays, e.g., often referred to as three-dimensional memory arrays. For example, a stacked memory array might include a plurality of vertical strings (e.g., NAND strings) of memory cells, e.g., coupled in series, between a source and a data line, such as a bit line. For example, the memory cells at a common location (e.g., at a common vertical level) might be commonly coupled to an access line (e.g., a local word line), that might, in turn, be selectively coupled to a voltage source by a transistor. A conductive line (e.g., that might be called a runner) might couple an access line to a source/drain of a respective transistor, while another source/drain of the respective transistor might be coupled to a respective voltage source by another conductive line (e.g., runner).

The term vertical may be defined, for example, as a direction that is perpendicular to a base structure, such as a surface of an integrated circuit die. It should be recognized the term vertical takes into account variations from "exactly" vertical due to routine manufacturing and/or assembly variations and that one of ordinary skill in the art would know what is meant by the term vertical.

For some stacked memory arrays, the transistors might be located under (e.g., at a vertical level under) the memory array. However, electric fields that might be produced during fabrication processes in the memory array above the transistors, for example, might have negative effects on various characteristics of the transistors, such as causing changes in the source-drain breakdown voltage Bvdss of the transistors, in the drain-to-source current when the transistor is on, in the drain-to-source saturation current Idss for a saturated condition, e.g., when the control gate of the transistor and the drain of the transistor are at the same voltage, e.g., that is greater than zero volts, etc.

For the reasons stated above, and for other reasons stated below which will become apparent to those skilled in the art upon reading and understanding the present specification, there is a need in the art for alternatives to existing transistor configurations for use in memory devices with stacked memory arrays and other applications.

DETAILED DESCRIPTION

Figure 1:
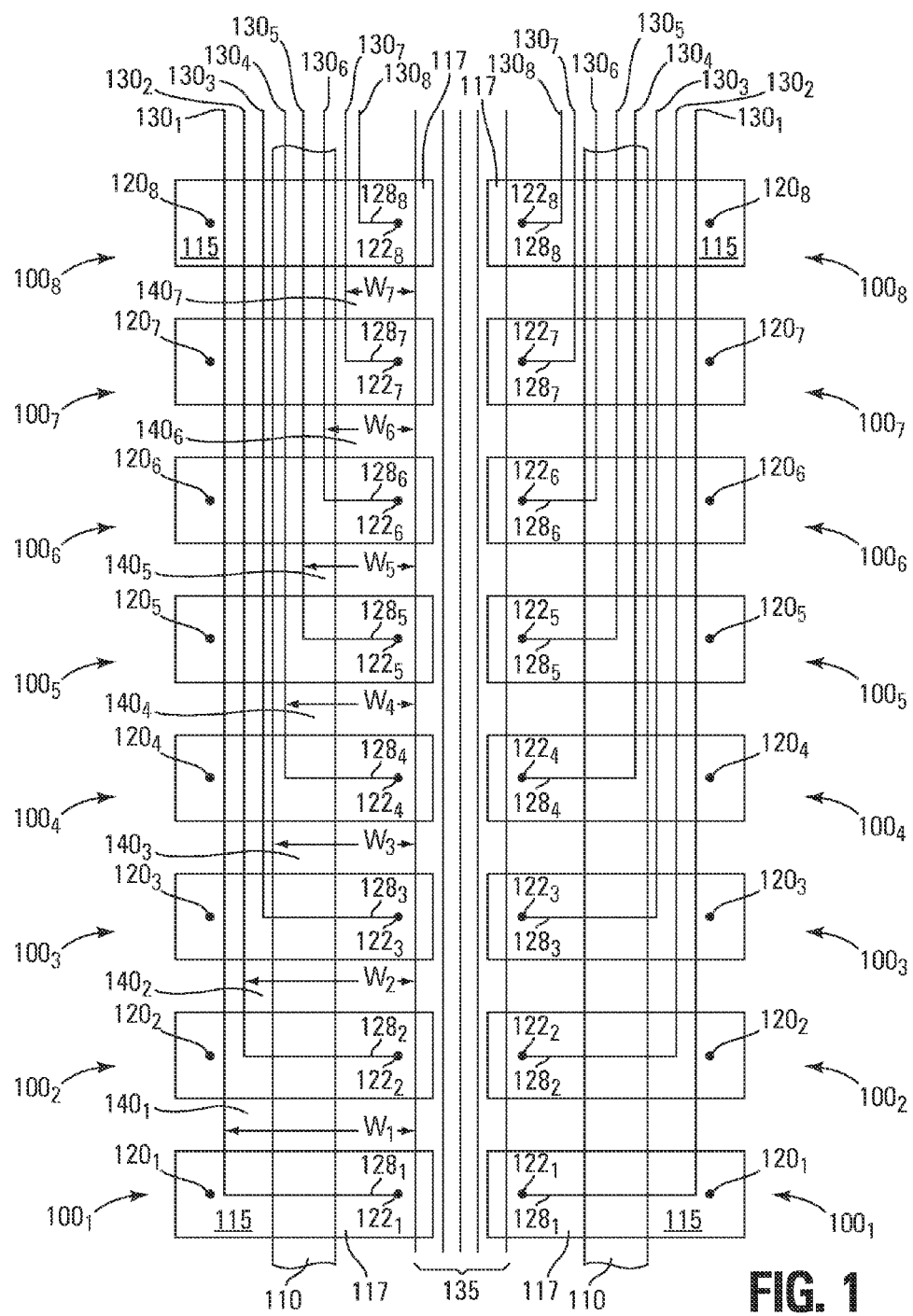
FIG. 1 is a top plan view of a portion of an array of transistors, according to the background art.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

FIG. 1 is a top plan view of a portion of an array of transistors 100, according to the background art. For example, transistors 100 may be field effect transistors (FETs). A plurality of transistors 100 (e.g., transistors $100_1$ to $100_8$) may be commonly coupled to each control line 110. Each of the transistors 100 might include a source/drain 115 and a source/drain 117. Transistors 100 might have a relatively high drain-source breakdown voltage (e.g., above about 15 volts to about 80 volts or greater). For example, the drain-source breakdown voltage may be defined as the voltage at which the transistor (e.g., the source or drain) breaks down while the transistor is turned off.

A contact 120, such as a global access- (e.g., word-) line contact, might be coupled to the source/drain 115 of each transistor 100, and a contact 122 might be coupled to the source/drain 117 of each transistor 100. For example, contacts $120_1$ to $120_8$ might be respectively coupled to the source/drains 115 of transistors $100_1$ to $100_8$. Contacts 120 and 122 might be electrical conductors, for example.

Contacts $120_1$ to $120_8$ might be respectively coupled to different lines (e.g., that might be called global access, e.g., word, lines) that may be respectively coupled to respective voltage sources (not shown). That is, for example, a respective voltage source might be coupled to each of the source/drains 115 of transistors $100_1$ to $100_8$.

Contacts $122_1$ to $122_8$ might be respectively coupled to lines $130_1$ to $130_8$ (e.g., that might be respectively called runners $130_1$ to $130_8$) by lines $128_1$ to $128_8$, such as transverse lines, that might be transverse to lines $130_1$ to $130_8$. That is, for example, the runners $130_1$ to $130_8$ might be respectively coupled the source/drains 117 of transistors $100_1$ to $100_8$ by lines $128_1$ to $128_8$ and contacts $122_1$ to $122_8$. In some examples, runners $130_1$ to $130_8$ might respectively include lines $128_1$ to $128_8$ as portions thereof. Runners $130_1$ to $130_8$ might be respectively coupled to access lines (e.g., word lines) (not shown in FIG. 1) that might be respectively commonly coupled to different pluralities of memory cells. Lines 128 and runners 130 might be conductors for example.

A plurality of memory cells commonly coupled to an access line might include a memory cell (e.g., a non-volatile memory cell) at a particular vertical level from each of a plurality of series-coupled vertical strings of memory cells of a stacked (e.g., three-dimensional) memory array. The array of transistors in FIG. 1 might be below the memory array, for example.

In some examples, lines, such as runners 135, e.g., that might be coupled to other circuitry, might be between the transistors 100 commonly coupled to one of the control lines 110 and the transistors 100 commonly coupled to the other one of the control lines 110. For example, runners 135 might be between the contacts 122 coupled to the source/drains 117 of the transistors 100 commonly coupled to one of the control lines 110 and the contacts 122 coupled to the source/drains 117 of the transistors 100 commonly coupled to the other one of the control lines 110. Runners 135 might be electrical conductors, for example.

At least a portion of each of runners $130_1$ to $130_8$ might be parallel to a respective control line 110, while at least a portion of some (e.g., each) of lines $128_1$ to $128_8$ might be perpendicular to runners $130_1$ to $130_8$, and thus to a respective control line 110. For example, lines 128 might extend in a direction from a respective source/drain 117 toward a respective source/drain 115. As used herein, the term parallel means parallel to within routine processing and/or assembly variations, and the term perpendicular means perpendicular to within routine processing and/or assembly variations and that one of ordinary skill in the art would know what is meant by the terms parallel and perpendicular.

Each of transistors $100_1$ to $100_8$ might be configured to selectively couple a voltage source to a respective access line. For example, an activated transistor 100 might couple a voltage source to a respective access line through a respective line 128 and a respective runner 130.

Starting with a transistor $100_1$, the number of runners 130 between the contacts 120 and 122 might increase with each successive transistor 100 along the length of a control line 110 from transistor $100_1$. Each successive transistor along the length of a control line 110 might add another runner 130. For example, only runner $130_1$ might be between the contacts $120_1$ and $122_1$ respectively coupled to source/drains 115 and 117 of transistor $100_1$. Runners $130_1$ and $130_2$ might be between contacts $120_2$ and $122_2$ respectively coupled to source/drains 115 and 117 of transistor $100_2$, runners $130_1$ to $130_3$ between contacts $120_3$ and $122_3$ respectively coupled to source/drains 115 and 117 of transistor $100_3$, runners $130_1$ to $130_4$ between contacts $120_4$ and $122_4$ respectively coupled to source/drains 115 and 117 of transistor $100_4$, etc. up to runners $130_1$ to $130_8$ between contacts $120_8$ and $122_8$ respectively coupled to source/drains 115 and 117 of transistor $100_8$.

For example, a runner $130_1$ might be coupled to a transistor $100_1$ and might extend over and be electrically isolated from transistors $100_2$ to $100_8$. A runner $130_2$ might be coupled to a transistor $100_2$, might be successively (e.g., immediately) adjacent to runner $130_1$, and might extend over and be electrically isolated from transistors $100_3$ to $100_8$. A runner $130_3$ might be coupled to a transistor $100_3$, might be successively (e.g., immediately) adjacent to runner $130_2$, and might extend over and be electrically isolated from transistors $100_4$ to $100_8$. Runners $130_1$ to $130_8$ might be electrically isolated from each other, for example.

The lengths of lines 128 coupled to the source/drains 117 might become progressively shorter as each runner 130 is added. For successively (e.g., immediately) adjacent transistors 100, the length of the line 128 coupled between, and thus the distance between, the contact 122 coupled to the source/drain 117 of one of those transistors 100 and the runner 130 coupled to that contact 122 might be different than the length of the line 128 coupled between, and thus the distance between, the contact 122 coupled to the source/drain 117 of the other of those transistors 100 and the runner 130 coupled to that contact 122. For example, the length of line $128_1$ coupled between the contact $122_1$ coupled to the source/drain 117 of transistor $100_1$ and the runner $130_1$ coupled to line $128_1$ might be greater than the length of line $128_2$ coupled between the contact $122_2$ coupled to the source/drain 117 of transistor $100_2$ and the runner $130_2$ coupled to line $128_2$. That is, for example, the distance between the contact $122_1$ coupled to the source/drain 117 of transistor $100_1$ and the runner $130_1$ coupled to the source/drain 117 of transistor $100_1$ might be greater than the distance between the contact $122_2$ coupled to the source/drain 117 of transistor $100_2$ and the runner $130_2$ coupled to the source/drain 117 of transistor $100_2$.

Regions 140 between the lines 128 of successively adjacent transistors 100 may be devoid of any runners. For example, a region 140 might extend (e.g., in a direction perpendicular to a respective control line 110 and thus a respective runner 130) from a runner 135 that might be over the source drains 117 of the successively adjacent transistors 100 to the runner 130 that is coupled to the line 128 that is coupled to the source/drain 117 of one of the successively adjacent transistors 100 and that is electrically isolated from the source/drain 117 of other one of the successively adjacent transistors 100.

A width W of a region 140 might be the distance the region 140 extends (e.g., in the direction perpendicular to a respective control line 110 and thus a respective runner 130) from a runner 135 that might be over the source drains 117 of the successively adjacent transistors 100 to the runner 130 that is coupled to the line 128 that is coupled to the source/drain 117 of one of the successively adjacent transistors 100 and that is electrically isolated from the source/drain 117 of other one of the successively adjacent transistors 100. For example, the width $W_1$ of region $140_1$ might be the distance from runner $130_1$ to the runner 135 over the source/drains 117 of transistors $100_1$ and $100_2$, as shown in FIG. 1. Note that widths $W_1$ to $W_7$ respectively of the regions $140_1$ to $140_7$ might respectively decrease, starting from between lines $128_1$ and $128_2$, e.g., starting from width $W_1$ of region $140_1$, along the length of the respective control line 110.

A region $140_1$ might be between the lines $128_1$ and $128_2$ respectively of successively adjacent transistors $100_1$ and $100_2$, a region $140_2$ between the lines $128_2$ and $128_3$ respectively of successively adjacent transistors $100_2$ and $100_3$, a region $140_3$ between the lines $128_3$ and $128_4$ respectively of successively adjacent transistors $100_3$ and $100_4$, a region $140_4$ between the lines $128_4$ and $128_5$ respectively of successively adjacent transistors $100_4$ and $100_5$, a region $140_5$ between the lines $128_5$ and $128_6$ respectively of successively adjacent transistors $100_5$ and $100_6$, a region $140_6$ between the lines $128_6$ and $128_7$ respectively of successively adjacent transistors $100_6$ and $100_7$, and a region $140_7$ between the lines $128_7$ and $128_8$ respectively of successively adjacent transistors $100_7$ and $100_8$.

Region $140_1$ might extend from the runner 135 that is over the source/drains 117 of the transistors $100_1$ to $100_8$ to the runner $130_1$ that is coupled to the line $128_1$ that is coupled to the source/drain 117 of transistor $100_1$ and that is electrically isolated from the source/drain 117 of transistor $100_2$. Region $140_2$ might extend from the runner 135 that is over the source/drains 117 of the transistors $100_1$ to $100_8$ to the runner $130_2$ that is coupled to the line $128_2$ that is coupled to the source/drain 117 of transistor $100_2$ and that is electrically isolated from the source/drain 117 of transistor $100_3$.

Width $W_2$ of region $140_2$ might be less than width $W_1$ of region $140_1$, width $W_3$ of region $140_3$ less than width $W_2$ of region $140_2$, width $W_4$ of region $140_4$ less than width $W_3$ of region $140_3$, width $W_5$ of region $140_5$ less than width $W_4$ of region $140_4$, width $W_6$ of region $140_6$ less than width $W_5$ of region $140_5$, and width $W_7$ of region $140_7$ less than width $W_6$ of region $140_6$.

Figure 2:
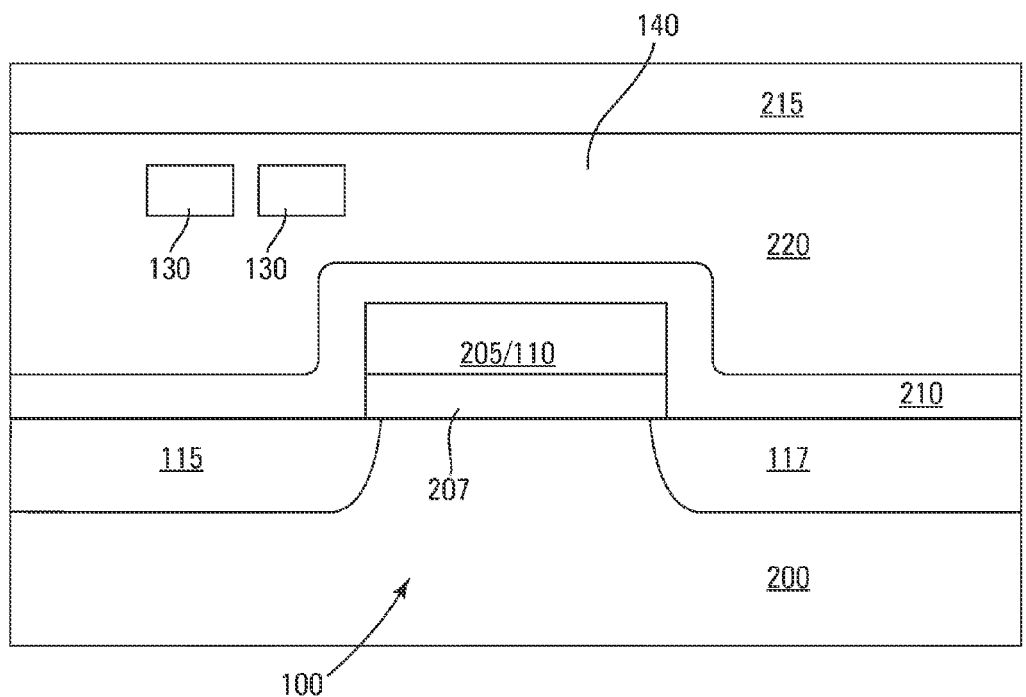
FIG. 2 illustrates a cross-section of a portion of an array of transistors, according to the background art.

FIG. 2 illustrates a cross-section of a portion of an array of transistors, such as a portion of the array of transistors in FIG. 1, including a transistor 100 and a portion of region 140 devoid of any runners 130 over a semiconductor 200, e.g., that might have a p-type conductivity. The transistor 100 might be below a memory array (e.g., a three-dimensional memory array), for example. A control gate 205 of transistor 100 might be formed over a gate dielectric 207 and might be coupled to or form a portion of a respective control line 110. A dielectric 210, such as nitride, might be over, e.g., might encapsulate, the transistor 100. A conductor 215, e.g., of metal, polysilicon, etc. might be over transistor 100 and might be coupled to the memory array. For example, conductor 215 might be over a dielectric 220 that is over dielectric 210. Runners 130 and lines 128 might be at the same vertical level that is above the vertical levels of dielectric 210 and control gate 205, and thus a control line 110, and that is below vertical level of conductor 215.

During fabrication of the memory array, high aspect-ratio (e.g., high depth-to-breadth-ratio) openings might be formed. For example, the openings might be for contacts that couple upper conductors in the memory array to conductor 215 or for stacks of memory cells formed over conductor 215, e.g., when conductor 215 might be polysilicon.

The openings might be formed using plasma etching, for example, that might produce ultraviolet and/or electric fields. For example, it is believed that in some instances, the plasma etch might produce a charge on conductor 215 that might produce an electric field between conductor 215 and dielectric 210. For example, when dielectric 210 is a nitride, it is believed that the electric field might, in some instances, cause the nitride to trap an electric charge, such as a positive electric charge, as a result of the electric field. It is believed that the positive electric charge might, in some instances, induce a negative electric charge on the source/drain regions of transistor 100, such as the source/drain region 117 in FIG. 2. It is believed that in some instances, the negative charge might cause the source/drain regions to appear to have a higher n-type doping than intended. In some instances, the apparent higher n-type doping, might cause a reduction in the source-drain breakdown voltage Bvdss of transistor 100, a change (e.g., reduction) in the saturation current Idss of transistor 100, a change (e.g., reduction) in the drain-to-source current when transistor 100 is on, and/or leakage in the junction between a contact, such as a contact 120 and/or a contact 122, and its respective source/drain, e.g., source/drain 115 and/or source/drain 117.

Figure 3:
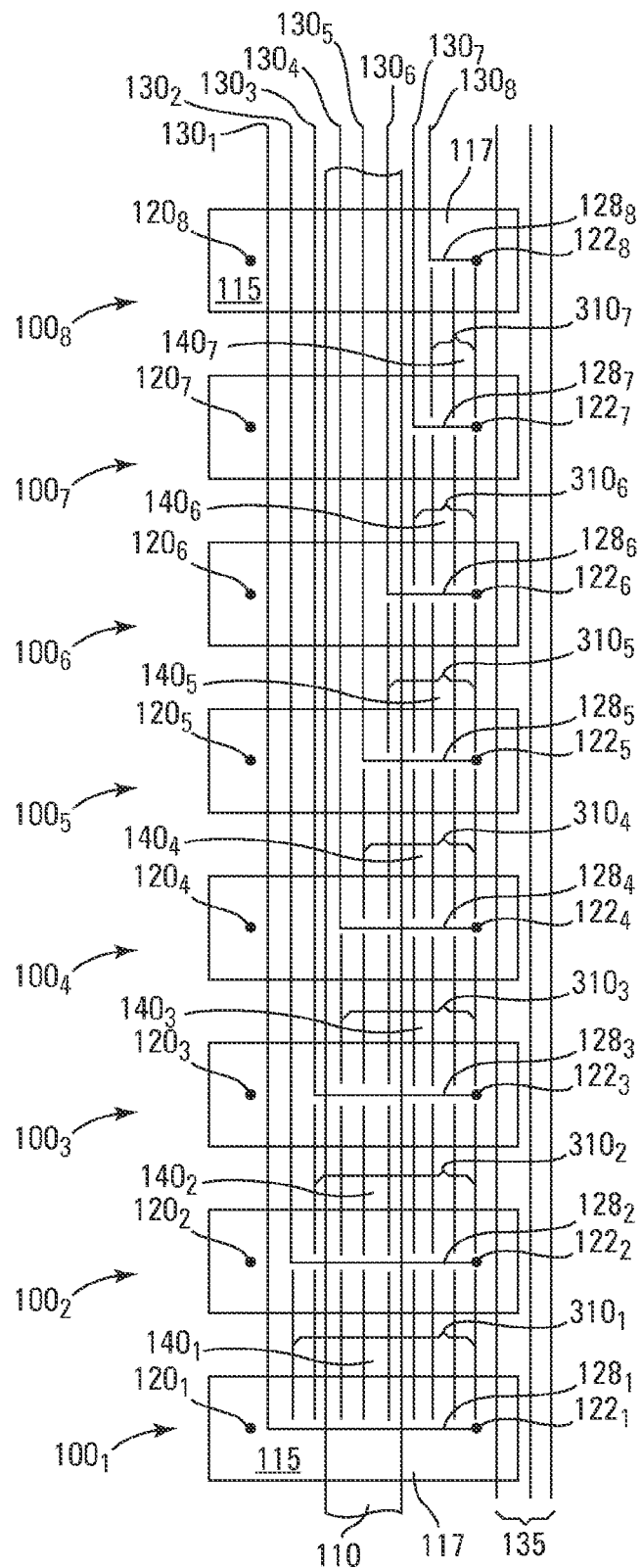
FIG. 3 is a top plan view of a portion of the array of transistors with dummy lines, according to an embodiment.

FIG. 3 is a top plan view of a portion of the array of transistors 100 described in conjunction with FIG. 1 with dummy lines, such as dummy runners 310, located in the regions 140 that were devoid of runners in FIG. 1. For example, dummy runners $310_1$ to $310_8$ might be respectively in the regions $140_1$ to $140_8$. Dummy runners 310 might be electrical conductors, for example.

Alternatively, the portion of the array of transistors 100 in FIG. 3 might be a portion of an array of double-gated transistors. For example, the portion of the array of transistors 100 in FIG. 3 might be the right side of the array of double-gated transistors and the left side of the array of double gated transistors might be a mirror image of the right side of the array of double-gated transistors, and thus a mirror image of the portion of the array of transistors 100 in FIG. 3. Therefore, the following discussion of FIG. 3 applies to the respective sides of an array of double-gated transistors.

For example, the source/drain 115 of a respective double-gated transistor might be between the two control gates of a respective double-gated transistor. Respective control lines 110 might be respectively commonly coupled to the respective control gates of the dual-gate transistors, for example, so that the source/drains 115 are between the control lines 110.

Dummy runners $310_1$ to $310_8$ might be respectively coupled to the lines $128_1$ to $128_8$ that are respectively coupled contacts $122_1$ to $122_8$ that are respectively coupled to the source/drains 117 of transistors $100_1$ to $100_8$. Therefore, for example, dummy runners $310_1$ to $310_8$ might be respectively coupled to transistors $100_1$ to $100_8$, e.g., respectively through lines $128_1$ to $128_8$ and respectively through contacts $122_1$ to $122_8$. Dummy runners $310_1$ to $310_8$ might also be respectively coupled to runners $130_1$ to $130_8$, e.g., through lines $128_1$ to $128_8$. Dummy runners 310 might be parallel to runners 130 and perpendicular to lines 128, for example.

A number of dummy runners 310 respectively coupled to the lines 128 coupled to the contacts 122 coupled to the source/drains 117 of successively (e.g., immediately) adjacent transistors 100 might be different, for example. That is, for example, the number of dummy runners 310 coupled to a first one of a pair of successively adjacent transistors 100 might be different than the number of dummy runners 310 coupled to a second one of the pair of successively adjacent transistors 100. For example, the number of dummy runners 310 coupled to the first one of the pair of successively adjacent transistors 100 might be one greater than the number of dummy runners 310 coupled to the second one of the pair of successively adjacent transistors 100. The dummy runners 310 coupled to first one of the pair of successively adjacent transistors 100 might be coupled to only the first one of the pair of successively adjacent transistors 100 and might be electrically isolated from the second one of the pair of successively adjacent transistors 100, while the dummy runners 310 coupled to the second one of the pair of successively adjacent transistors 100 might be coupled to only the second one of the pair of successively adjacent transistors 100 and electrically isolated from the first one of the pair of successively adjacent transistors 100.

The dummy runners 310 coupled to the first one of the pair of successively adjacent transistors 100 might extend to the second one of the pair of successively adjacent transistors 100. The dummy runners 310 coupled to the second one of the pair of successively adjacent transistors 100 might extend to a third transistor 100 successively adjacent to the second one of the pair of successively adjacent transistors 100, where the second one of the successively adjacent transistors 100 might be between the first one of the pair of successively adjacent transistors 100 and the third transistor 100 and where the dummy lines 310 coupled to the second one of the pair of successively adjacent transistors 100 might be electrically isolated from third transistor 100.

In FIG. 3, different numbers of dummy runners might be respectively between different respective pairs of the respective lines 128. For example, dummy runners $310_1$ might be between a pair of successively adjacent lines $128_1$ and $128_2$; dummy runners $310_2$ might be between a pair of successively adjacent lines $128_2$ and $128_3$, dummy runners $310_3$ might be between a pair of successively adjacent lines $128_3$ and $128_4$; dummy runners $310_4$ might be between a pair of successively adjacent lines $128_4$ and $128_5$; etc. The respective lines 128 of each of the different respective pairs of lines 128 might be respectively coupled to a pair of successively adjacent transistors 100. For example, lines $128_1$ and $128_2$ might be respectively coupled to the pair of successively adjacent transistors $100_1$ and $100_2$; lines $128_2$ and $128_3$ might be respectively coupled to the pair of successively adjacent transistors $100_2$ and $100_3$; lines $128_3$ and $128_4$ might be respectively coupled to the pair of successively adjacent transistors $100_3$ and $100_4$; lines $128_4$ and $128_5$ might be respectively coupled to the pair of successively adjacent transistors $100_4$ and $100_5$; etc.

Line $128_2$ might be common to the pair of lines $128_1$ and $128_2$ and the pair of lines $128_2$ and $128_3$, line $128_3$ might be common to pair of lines $128_2$ and $128_3$ and the pair of lines $128_3$ and $128_4$, etc. Transistor $100_2$ might be common to the pair of successively adjacent transistors $100_1$ and $100_2$ and the pair of successively adjacent transistors $100_2$ and $100_3$, transistor $100_3$ might be common to the pair of successively adjacent transistors $100_2$ and $100_3$ and the pair of successively adjacent transistors $100_3$ and $100_4$, etc.

Figure 4A:
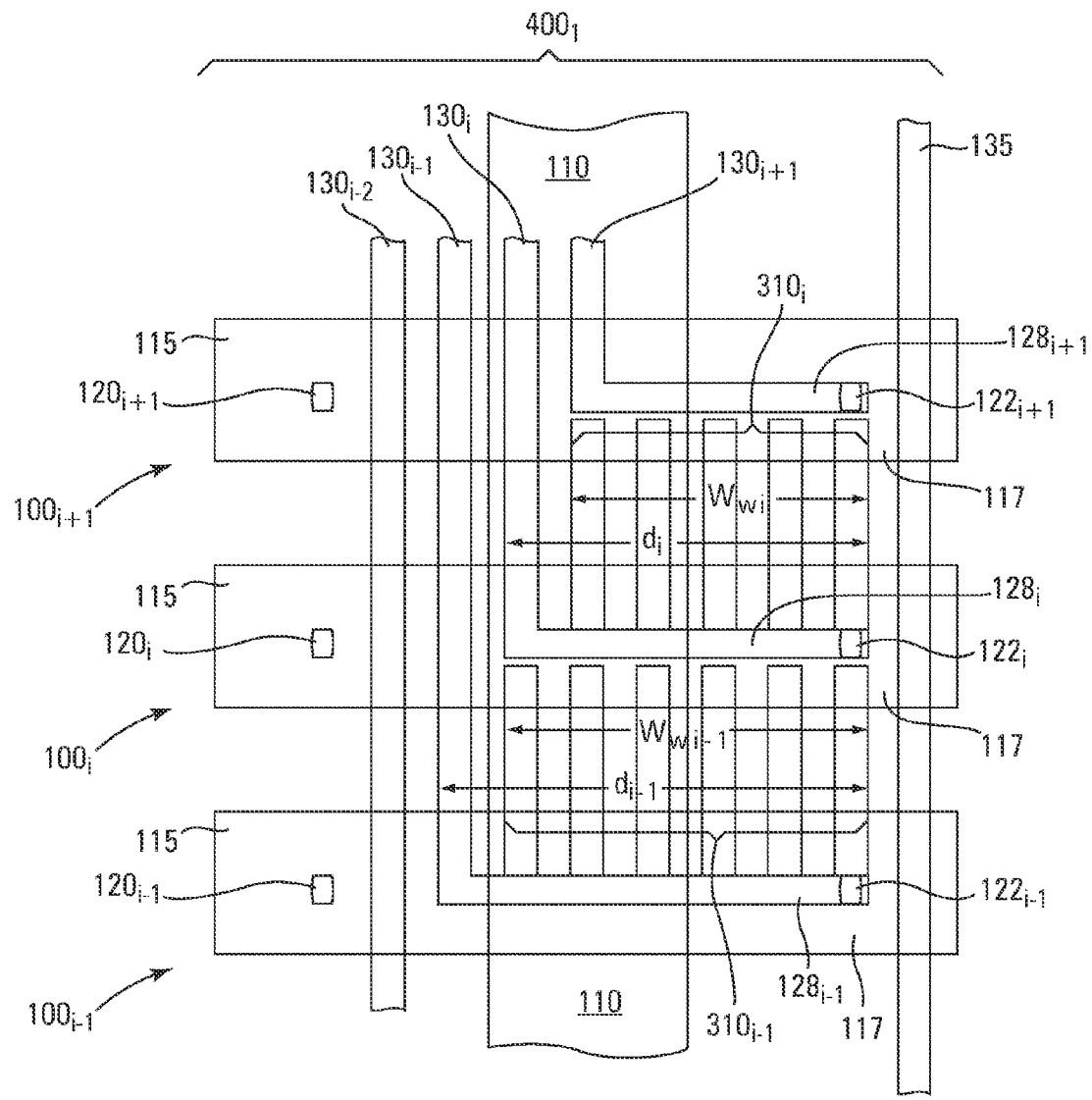
FIG. 4A is an enlarged view of a portion of an array of transistors, according to an embodiment.

FIG. 4A is an enlarged top plan view of a portion $400_1$ of an array of transistors 100. The portion $400_1$ in FIG. 4A might be a portion of an array of double-gated transistors 100. For example, the portion $400_1$ in FIG. 4A might be the right side of the array of double-gated transistors 100 in the top plan view of FIG. 4B. The array of double-gated transistors 100 in FIG. 4B might include a portion $400_2$ that forms the left side of the array of double-gated transistors 100. For example, portions $400_1$ and $400_2$ in FIG. 4B might be mirror images of each other. That is, the array of double-gated transistors 100 in FIG. 4B might be symmetric about the central axis 410.

Figure 4B:
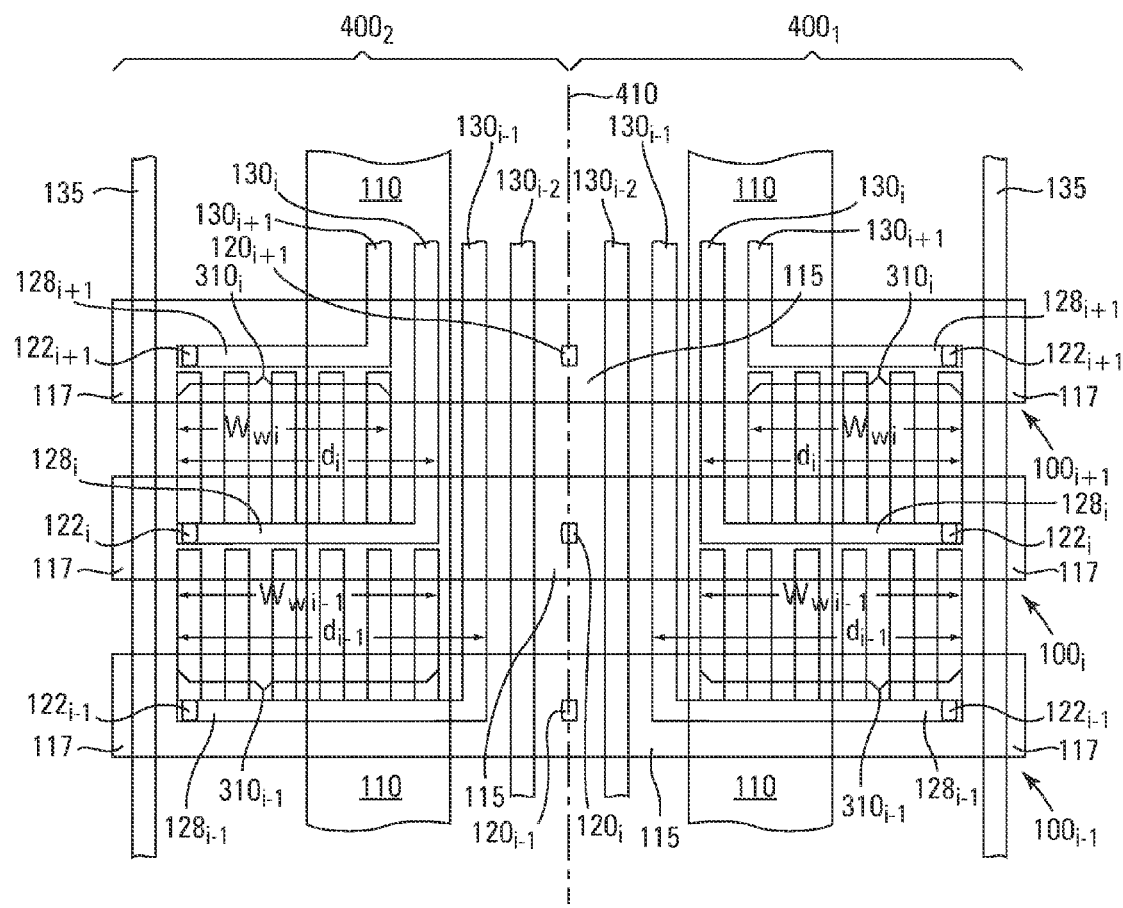
FIG. 4B is an enlarged view of a portion of an array of double-gated transistors, according to an embodiment.

Each of the double-gated transistors $100_{i-1}$, $100_i$, and $100_{i+1}$ in FIG. 4B might have a source/drain 115 between its control gates. The control gates on either side of the source/drains 115 of double-gated transistors $100_{i-1}$, $100_i$, and $100_{i+1}$ might be commonly coupled to (e.g., or form a portion of) a respective control line 110. The contacts $120_{i-1}$ to $120_{i+1}$ that may be respectively coupled to the source/drains 115 of double-gated transistors $100_{i-1}$ to $100_{i+1}$ might lie on the central axis 410, for example.

The respective control gates of double-gated transistors $100_{i-1}$, $100_i$, and $100_{i+1}$ might be between a source/drain 115 and a respective source/drain 117. As such, the respective control lines 110 might be between a source/drain 115 and a respective source/drain 117 of double-gated transistors $100_{i-1}$, $100_i$, and $100_{i+1}$. Note that common numbering is used to denote similar (e.g., the same) components in portions $400_1$ and $400_2$ in FIG. 4B.

FIGS. 4A and 4B show a transistor $100_{i-1}$ successively (e.g., immediately) adjacent to a transistor $100_i$ successively (e.g., immediately) adjacent to a transistor $100_{i+1}$. One or more dummy runners $310_{i-1}$ might be between a line $128_{i-1}$ that is coupled to a contact $122_{i-1}$ that is coupled to a source/drain 117 of transistor $100_{i-1}$ and a line $128_i$ that is coupled to a contact $122_i$ that is coupled to a source/drain 117 of transistor $100_i$. The one or more dummy runners $310_{i-1}$ might be coupled to, e.g., by direct contact with, line $128_{i-1}$. For example, the one or more dummy runners $310_{i-1}$ might be coupled to transistor $100_{i-1}$, e.g., through line $128_{i-1}$ and a contact $122_{i-1}$. The one or more dummy runners $310_{i-1}$ might also be coupled to runner $130_{i-1}$, e.g., through line $128_{i-1}$.

The one or more dummy runners $310_{i-1}$ might only be coupled to line $128_{i-1}$, and thus to runner $130_{i-1}$ and contact $122_{i-1}$ and thus to the source/drain 117 of transistor $100_{i-1}$, for example, and be electrically isolated from line $128_i$, and thus be electrically isolated from runner $130_i$ and contact $122_i$ and thus be electrically isolated from the source/drain 117 of transistor $100_i$. There might be a space, e.g., containing a dielectric, between an end of each of the dummy runners $310_{i-1}$, e.g., opposite to an end of the respective dummy runner $310_{i-1}$ that is coupled to line $128_{i-1}$, and line $128_i$, as shown in FIGS. 4A and 4B. The one or more dummy runners $310_{i-1}$ might extend from (e.g., a vertical location directly above) transistor $100_{i-1}$ to (e.g., a vertical location directly above) transistor $100_i$, as shown in FIGS. 4A and 4B. One of the dummy runners $310_{i-1}$, e.g., the dummy runner $310_{i-1}$ successively (e.g., immediately) adjacent to runner $130_{i-1}$, might be directly aligned (e.g., directly in line) with runner $130_i$.

One or more dummy runners $310_i$ might be between a line $128_i$ that is coupled to a contact $122_i$ that is coupled to a source/drain 117 of transistor $100_i$ and a line $128_{i+1}$ that is coupled to a contact $122_{i+1}$ that is coupled to a source/drain 117 of transistor $100_{i+1}$. The one or more dummy runners $310_i$ might be coupled to, e.g., by direct contact with, line $128_i$. For example, the one or more dummy runners $310_i$ might be coupled to transistor $100_i$, e.g., through line $128_i$ and contact $122_i$. The one or more dummy runners $310_i$ might also be coupled to runner $130_i$, e.g., through line $128_i$.

The one or more dummy runners $310_i$ might only be coupled to line $128_i$, and thus to runner $130_i$ and contact $122_i$ and thus to the source/drain 117 of transistor $100_i$, for example, and electrically isolated from line $128_{i-1}$, and thus electrically isolated from runner $130_{i-1}$ and contact $122_{i-1}$ and thus electrically isolated from the source/drain 117 of transistor $100_{i-1}$, and electrically isolated from line $128_{i+1}$, and thus electrically isolated from runner $130_{i+1}$ and contact $122_{i+1}$ and thus electrically isolated from the source/drain 117 of transistor $100_{i+1}$. There might be a space, e.g., containing a dielectric, between an end of each of the dummy runners $310_i$ (e.g., opposite to an end of the respective dummy runner $310_{i-1}$ that is coupled to line $128_i$) and line $128_{i+1}$, as shown in FIGS. 4A and 4B. The one or more dummy runners $310_i$ might extend from (e.g., a vertical location directly above) transistor $100_i$ to (e.g., a vertical location directly above) transistor $100_{i+1}$, as shown in FIGS. 4A and 4B.

One of the dummy runners $310_i$, e.g., the dummy runner $310_i$ successively (e.g., immediately) adjacent to runner $130_i$, might be directly aligned (e.g., directly in line) with runner $130_{i+1}$. Runner $130_i$ might be between runner $130_{i-1}$ and that one dummy runner $310_i$, as shown in FIGS. 4A and 4B.

A distance (e.g., a width) $d_{i-1}$, in a direction (e.g., from source/drains 115 of transistors $100_{i-1}$ and $100_i$ toward source/drains 117 of transistors $100_{i-1}$ and $100_i$) perpendicular to a control line 110, and thus to runners 130 and dummy runners 310, spanned by the runner $130_{i-1}$ coupled to transistor $100_{i-1}$ and the dummy runners $310_{i-1}$ coupled to transistor $100_{i-1}$ might be greater than a distance (e.g., a width) $d_i$, in a direction (e.g., from source/drains 115 of transistors $100_i$ and $100_{i+1}$ toward source/drains 117 of transistors $100_i$ and $100_{i+1}$) perpendicular to control line 110, and thus to runners 130 and dummy runners 310, spanned by the runner $130_i$ coupled to transistor $100_i$ and the dummy runners $310_i$ coupled to transistor $100_i$, as shown in FIGS. 4A and 4B. For example, the distance $d_{i-1}$ might include the collective widths (e.g., in a direction perpendicular to a control line 110) of runner $130_{i-1}$ and the respective dummy runners $310_{i-1}$ and the collective widths (e.g., in a direction perpendicular to the control line 110) of the space (e.g., containing a dielectric) between runner $130_{i-1}$ and the dummy runners $310_{i-1}$ and the spaces (e.g., each containing a dielectric) between the dummy runners $310_i$. The distance for example, might include the collective widths (e.g., in a direction perpendicular to the control line 110) of runner $130_i$ and the respective dummy runners $310_i$ and the collective widths (e.g., in a direction perpendicular to the control line 110) of the space (e.g., containing a dielectric) between runner $130_i$ and the dummy runners $310_{i-1}$ and the spaces (e.g., each containing a dielectric) between the dummy runners $310_i$.

The one or more dummy runners $310_{i-1}$ coupled to line $128_{i-1}$, and thus to runner $130_{i-1}$ and transistor $100_{i-1}$, might span a greater distance, in a direction perpendicular to a control line 110, and thus to runners 130 and dummy runners 310, than the one or more dummy runners $310_i$ coupled to line $128_i$, and thus to runner $130_i$ and transistor $100_i$. For example, as shown in FIGS. 4A and 4B, a distance (e.g., a width) $W_{wi-1}$ spanned by dummy runners $310_{i-1}$ in a direction (e.g., from source/drains 115 of transistors $100_{i-1}$ and $100_i$ toward source/drains 117 of transistors $100_{i-1}$ and $100_i$) perpendicular to control line 110 might be greater than a distance (e.g., a width) $W_{wi}$ spanned by dummy runners $310_i$ in a direction (e.g., from source/drains 115 of transistors $100_i$ and $100_{i+1}$ toward source/drains 117 of transistors $100_i$ and $100_{i+1}$) perpendicular to control line 110. For example, the distance $W_{wi-1}$ spanned by dummy runners $310_{i-1}$ might include the collective widths (e.g., in a direction perpendicular to a control line 110) of dummy runners $310_{i-1}$ and the collective widths (e.g., in a direction perpendicular to control line 110) of the spaces between dummy runners $310_{i-1}$. The distance $W_{wi}$, for example, spanned by dummy runners $310_i$ might include the collective widths (e.g., in a direction perpendicular to control line 110) of dummy runners $310_i$ and the collective widths (e.g., in a direction perpendicular to a control line 110) of the spaces between dummy runners $310_i$.

The number of dummy runners $310_{i-1}$ coupled to line $128_{i-1}$, and thus to runner $130_{i-1}$ and transistor $100_{i-1}$, might be greater than, e.g., one greater than, the number of dummy runners $310_i$ coupled to line $128_i$, and thus to runner $130_i$ and transistor $100_i$. For example, the one or more dummy runners $310_{i-1}$ might include two or more dummy runners $310_{i-1}$.

The width of each of the dummy runners $310_{i-1}$ might be the same as the width of each of the dummy runners $310_i$, and the width of each of the spaces between dummy runners $310_{i-1}$ might be the same as the width of each of the spaces between dummy runners $310_i$. Therefore, the distance $W_{wi-1}$ might be greater than the distance $W_{wi}$ as a result of the number of dummy runners $310_{i-1}$ being greater than the number of dummy runners $310_i$ and the number of the spaces respectively between dummy runners $310_{i-1}$ being greater than the number of the spaces respectively between dummy runners $310_i$.

The collective width of the one or more dummy runners $310_{i-1}$ might be greater than the collective width of the one or more dummy runners $310_i$. The one or more dummy runners $310_{i-1}$ might include only a single dummy runner $310_{i-1}$, and the one or more dummy runners $310_{i-1}$ might include only a single dummy runner $310_i$, in which case the collective widths are the widths of the single dummy runners. Alternatively, the one or more dummy runners $310_{i-1}$ might include two or more dummy runners $310_{i-1}$ and collective width of the two or more dummy runners $310_{i-1}$ might be greater than the collective width of the one or more dummy runners $310_i$ as a result of the number of dummy runners $310_{i-1}$ being greater than (e.g., by one dummy runner) the number of dummy runners $310_i$, e.g., when each of the dummy runners $310_{i-1}$ have the same width as each of the dummy runners $310_i$.

Runners $130_{i-1}$ and $130_i$ might also have the same widths and the space between runner $130_{i-1}$ and dummy runners $310_{i-1}$ and the space between runner $130_i$ and dummy runners $310_i$ might also have the same widths. Therefore, the distance $d_{i-1}$ might be greater than the distance $d_i$ as a result of the number of dummy runners $310_{i-1}$ being greater than the number of dummy runners $310_i$ and the number of spaces between the dummy runners $310_{i-1}$ being greater than the number of spaces between the dummy runners $310_i$. For some embodiments, the dummy runners 310 might have the same pitch (e.g., center-to-center spacing) and same widths as the runners 130. As used herein entities, such as distances, widths, pitches, etc., being the same might be the same to within routine processing and/or assembly variations and that one of ordinary skill in the art would know what is meant by entities being the same.

The one or more dummy runners $310_{i-1}$ extending from transistor $100_{i-1}$ to transistor $100_i$ might be over a portion (e.g., a portion of dielectric 210 and/or control gate 205, FIGS. 2 and 4C) of transistor $100_i$ on one side of the line $128_i$ coupled to transistor $100_i$, and the one or more dummy runners $310_i$ extending from transistor $100_i$ to transistor $100_{i+1}$ might be over another portion (e.g., another portion of dielectric 210 and/or control gate 205) of transistor $100_i$ on the other side of line $128_i$. The one or more dummy runners $310_{i-1}$ might be electrically isolated from transistor $100_i$ and the one or more dummy runners $310_i$ might be coupled to transistor $100_i$, as shown in FIGS. 4A and 4B. For example, the one or more dummy runners $310_{i-1}$ might be electrically isolated from line $128_i$, while the one or more dummy runners $310_i$ might be coupled to line $128_i$. Therefore, the width $W_{wi-1}$ spanned by the one or more dummy runners $310_{i-1}$ on the one side of line $128_i$ might be greater than the width $W_{wi}$ spanned by the one or more dummy runners $310_i$ on the other side of line $128_i$. For example, there might be more dummy runners (e.g., one more dummy runner) on the one side of line $128_i$ than on the other.

Figure 4C:
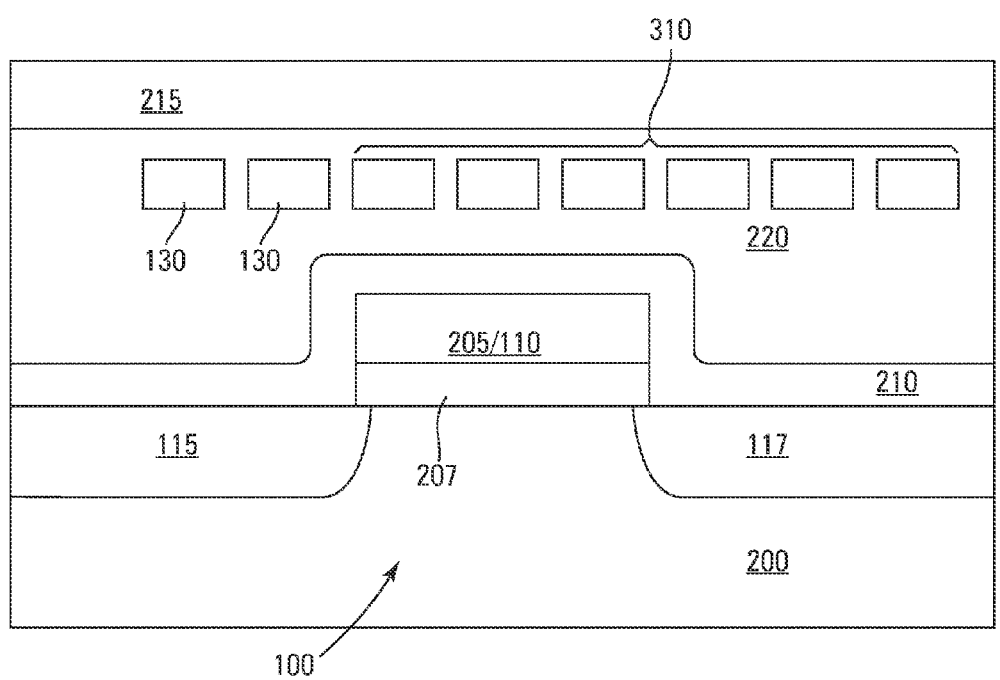
FIG. 4C illustrates a cross-section of a portion of an array of transistors with one or more dummy runners, according to an embodiment.

FIG. 4C illustrates a cross-section of a portion of an array of transistors 100 with one or more dummy runners 310. The one or more dummy runners 310 might be at the same vertical level as runners 130 and lines 128. That is, for example, the one or more dummy runners 310 might be at a vertical level that is above the vertical levels of control gate 205, and thus a control line 110, and dielectric 210 and that is below the vertical level of conductor 215. For example, the one or more dummy runners 310 might be between dielectric 210 and conductor 215. The source/drains 117 might be coupled to ground, for example, during fabrication of a memory array that might be above the arrays of transistors in FIGS. 3, 4A, and 4B. For example, the one or more dummy runners 310 might be coupled to ground.

As indicated above in conjunction with FIG. 2, the fabrication of the memory array might produce a charge on conductor 215 that might produce an electric field between conductor 215 and dielectric 210. The electric field might cause dielectric 210 to trap an electric charge, e.g., when dielectric 210 is a nitride.

The one or more (e.g., grounded) dummy runners 310 might act to protect dielectric 210 from the electric field, and thus might act to reduce the likelihood of dielectric 210 trapping charge that might possibly induce a negative charge on source/drain regions 115 and 117. For example, the one or more (e.g., grounded) dummy runners 310 might act to reduce the likelihood of a reduction in the source-drain breakdown voltage Bvdss of the transistor 100, a reduction in the saturation current Idss of transistor 100, a reduction in the drain-to-source current when transistor 100 is on, and/or leakage in the junction between a contact and source/drain 115 and/or source/drain 117, e.g., due the possibility of the negative charge that might possibly be induced on source/drain regions 115 and 117.

Figure 5:
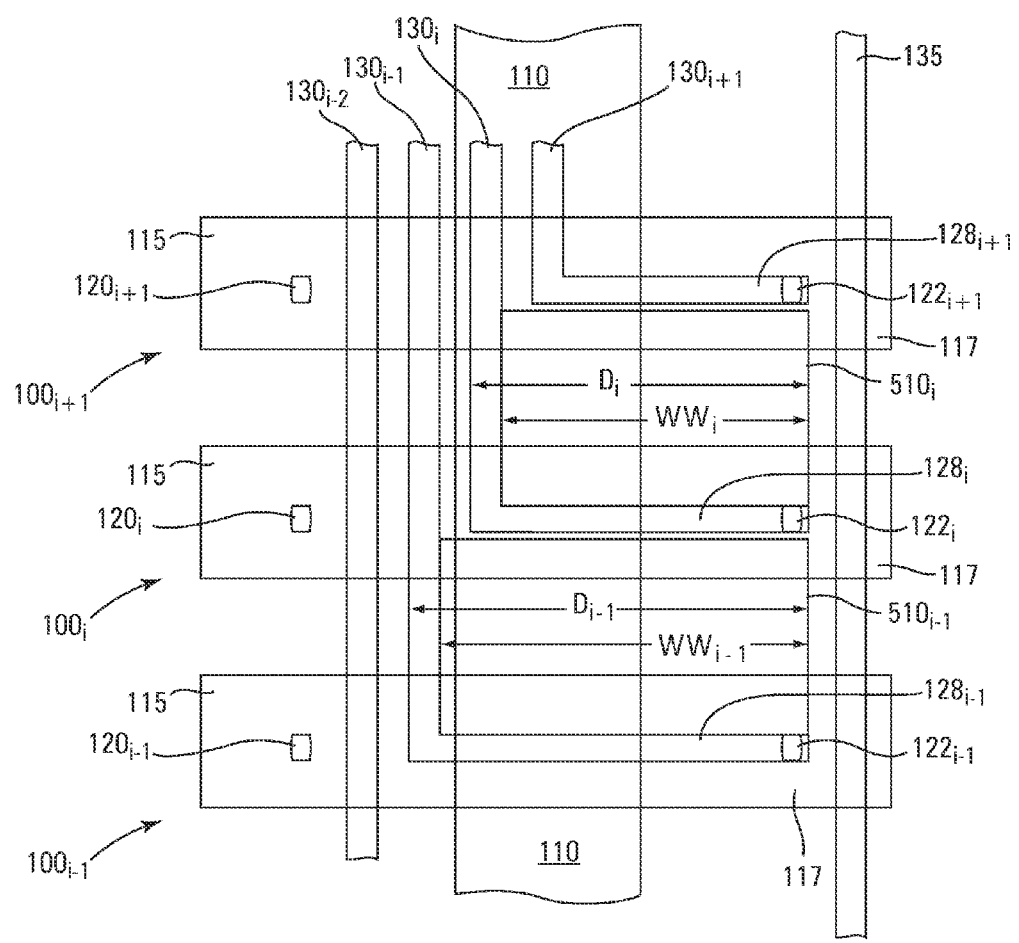
FIG. 5 is an enlarged view of a portion of an array of transistors with dummy lines, according to another embodiment.

FIG. 5 is an enlarged view of a portion of an array of transistors 100. The portion of the array of transistors 100 in FIG. 5 might be a portion of an array of double-gated transistors. For example, the portion of the array of transistors 100 in FIG. 5 might be the right side of the array of double-gated transistors and the left side of the array of double gated transistors might be a mirror image of the right side of the array of double-gated transistors and thus a mirror image of the portion of the array of transistors in FIG. 5. Therefore, the following discussion of FIG. 5 applies to the respective sides of an array of double-gated transistors.

FIG. 5 shows a transistor $100_{i-1}$ successively adjacent to a transistor $100_i$ successively adjacent to a transistor $100_{i+1}$. A single dummy line, e.g., dummy runner, $510_{i-1}$, such as a plate, might be between a line $128_{i-1}$ that is coupled to a contact $122_{i-1}$ that is coupled to a source/drain 117 of transistor $100_{i-1}$ and a line $128_i$ that is coupled to a contact $122_i$ that is coupled to a source/drain 117 of transistor $100_i$. Dummy runner $510_{i-1}$ might be coupled to, e.g., by direct contact with, line $128_{i-1}$. Dummy runner $510_{i-1}$ might be coupled to transistor $100_{i-1}$, e.g., through line $128_{i-1}$ and contact $122_{i-1}$. Dummy runner $510_{i-1}$ might also be coupled to runner $130_{i-1}$, e.g., through line $128_{i-1}$ and/or by direct contact with runner $130_{i-1}$. Dummy runner $510_{i-1}$ might be an electrical conductor, for example.

Dummy runner $510_{i-1}$ might be between the conductor 215 and the dielectric 210 in FIG. 4C, e.g., in place of the dummy runners 310. That is, for example, dummy runner $510_{i-1}$ might be at the same vertical level as runners 130 and lines 128, and thus at a vertical level that is above the vertical levels of control gate 205, and thus control line 110, and dielectric 210 and below the vertical of conductor 215. For example, one or more dummy runners might include the single dummy runner $510_{i-1}$.

Dummy runner $510_{i-1}$ might only be coupled to line $128_{i-1}$ and/or to runner $130_{i-1}$, and thus contact $122_{i-1}$ and thus to the source/drain 117 of transistor $100_{i-1}$, for example. Dummy runner $510_{i-1}$ might be electrically isolated from line $128_i$, and thus from runner $130_i$ and contact $122_i$ and thus from the source/drain 117 of transistor $100_i$. There might be a space, e.g., containing a dielectric, between dummy runner $510_{i-1}$ and line $128_i$, as shown in FIG. 5. Dummy runner $510_{i-1}$ might extend from (e.g., a vertical location directly above) transistor $100_{i-1}$ to (e.g., a vertical location directly above) transistor $100_i$, as shown in FIG. 5. Dummy runner $510_{i-1}$ might form a portion of runner $130_{i-1}$, for example.

A single dummy line, e.g., dummy runner, $510_i$, such as a plate, might be between a line $128_i$ that is coupled to a contact $122_i$ that is coupled to a source/drain 117 of transistor $100_i$ and a line $128_{i+1}$ that is coupled to a contact $122_{i+1}$ that is coupled to a source/drain 117 of transistor $100_{i+1}$. Dummy runner $510_i$ might be coupled to, e.g., by direct contact with, line $128_i$. Dummy runner $510_i$ might be coupled to transistor $100_i$, e.g., through line $128_i$ and contact $122_i$. Dummy runner $510_i$ might also be coupled to runner $130_i$, e.g., through line $128_i$ and/or by direct contact with runner $130_i$. Dummy runner $510_i$ might be an electrical conductor, for example.

Dummy runner $510_i$ might between the conductor 215 and the dielectric 210 in FIG. 4C, e.g., in place of the dummy runners 310. That is, for example, dummy runner $510_i$ might be at the same vertical level as dummy runner $510_{i-1}$, runners 130, and lines 128. For example, one or more dummy runners might include the single dummy runner $510_i$.

Dummy runner $510_i$ might only be coupled to line $128_i$ and/or to runner $130_i$, and thus contact $122_i$ and thus to the source/drain 117 of transistor $100_i$, for example. Dummy runner $510_i$ might be electrically isolated from line $128_{i+1}$, and thus from runner $130_{i+1}$ and contact $122_{i+1}$ and thus from the source/drain 117 of transistor $100_{i+1}$. There might be a space, e.g., containing a dielectric, between dummy runner $510_i$ and line $128_{i+1}$, as shown in FIG. 5. Dummy runner $510_i$ might extend from (e.g., a vertical location directly above) transistor $100_i$ to (e.g., a vertical location directly above) transistor $100_{i+i}$, as shown in FIG. 5. Dummy runner $510_i$ might form a portion of runner $130_i$, for example.

A distance (e.g., a width) $D_{i-1}$, in a direction (e.g., from source/drains 115 of transistors $100_{i-1}$ and $100_i$ toward source/drains 117 of transistors $100_{i-1}$ and $100_i$) perpendicular to a control line 110, and thus to runners 130, spanned by the runner $130_{i-1}$ coupled to transistor $100_{i-1}$ and the dummy runner $510_{i-1}$ coupled to transistor $100_{i-1}$ might be greater than a distance (e.g., a width) $D_i$, in a direction (e.g., from source/drains 115 of transistors $100_i$ and $100_{i+1}$ toward source/drains 117 of transistors $100_i$ and $100_{i+1}$) perpendicular to control line 110, and thus to runners 130 and dummy runners 310, spanned by the runner $130_i$ coupled to transistor $100_i$ and the dummy runner $510_i$ coupled to transistor $100_i$, as shown in FIG. 5.

Dummy runner $510_{i-1}$ might span a greater distance, in a direction (e.g., from source/drains 115 of transistors $100_{i-1}$ and $100_i$ toward source/drains 117 of transistors $100_{i-1}$ and $100_i$) perpendicular to a control line 110, and thus to runners 130, than dummy runner $510_i$. For example, as shown in FIG. 5, a distance (e.g., a width) $WW_{i-1}$ spanned by dummy runner $510_{i-1}$ in a direction perpendicular to control line 110 might be greater than a distance (e.g., a width) $WW_i$ spanned by dummy runner $510_i$ in a direction perpendicular to a control line 110.

Note that the dummy runner $510_{i-1}$, extending from transistor $100_{i-1}$ to transistor $100_i$, might be over a portion (e.g., a portion of dielectric 210 and/or control gate 205, FIGS. 2 and 4C) of transistor $100_i$ on one side of the line $128_i$ coupled to transistor $100_i$, and the dummy runner $510_i$, extending from transistor $100_i$ to transistor $100_{i+1}$, might be over another portion (e.g., another portion of dielectric 210 and/or control gate 205) of transistor $100_i$ on the other side of line $128_i$. Dummy runner $510_{i-1}$ might be electrically isolated from transistor $100_i$, and dummy runner $510_i$ might be coupled to transistor $100_i$, as shown in FIG. 5. For example, dummy runner $510_{i-1}$ might be electrically isolated from line $128_i$, while dummy runner $510_i$ might be coupled to line $128_i$. Therefore, the width $WW_{i-1}$ spanned by the dummy runner $510_{i-1}$ on the one side of line $128_i$ might be greater than the width $WW_i$ spanned by the dummy runner $510_i$ on the other side of line $128_i$.

The dummy runners 510 might be grounded, for example, during the fabrication of the memory array above the transistor array in FIG. 5, e.g., as a result of source/drains 117 being grounded. A grounded dummy runner 510 might act to protect dielectric 210 (FIG. 4C), and thus might act to reduce the likelihood of dielectric 210 trapping a charge that might possibly induce a negative charge on source/drain regions 115 and 117. For example, a grounded dummy runner 510 might act to reduce the likelihood of a reduction in the source-drain breakdown voltage Bvdss of the transistor 100, a reduction in the saturation current Idss of transistor 100, a reduction in the drain-to-source current when transistor 100 is on, e.g., when the control gate is biased above zero volts, and/or leakage in the junction between a contact and source/drain 115 and/or source/drain 117, e.g., due the possibility of the negative charge that might possibly be induced on source/drain regions 115 and 117.

Figure 6:
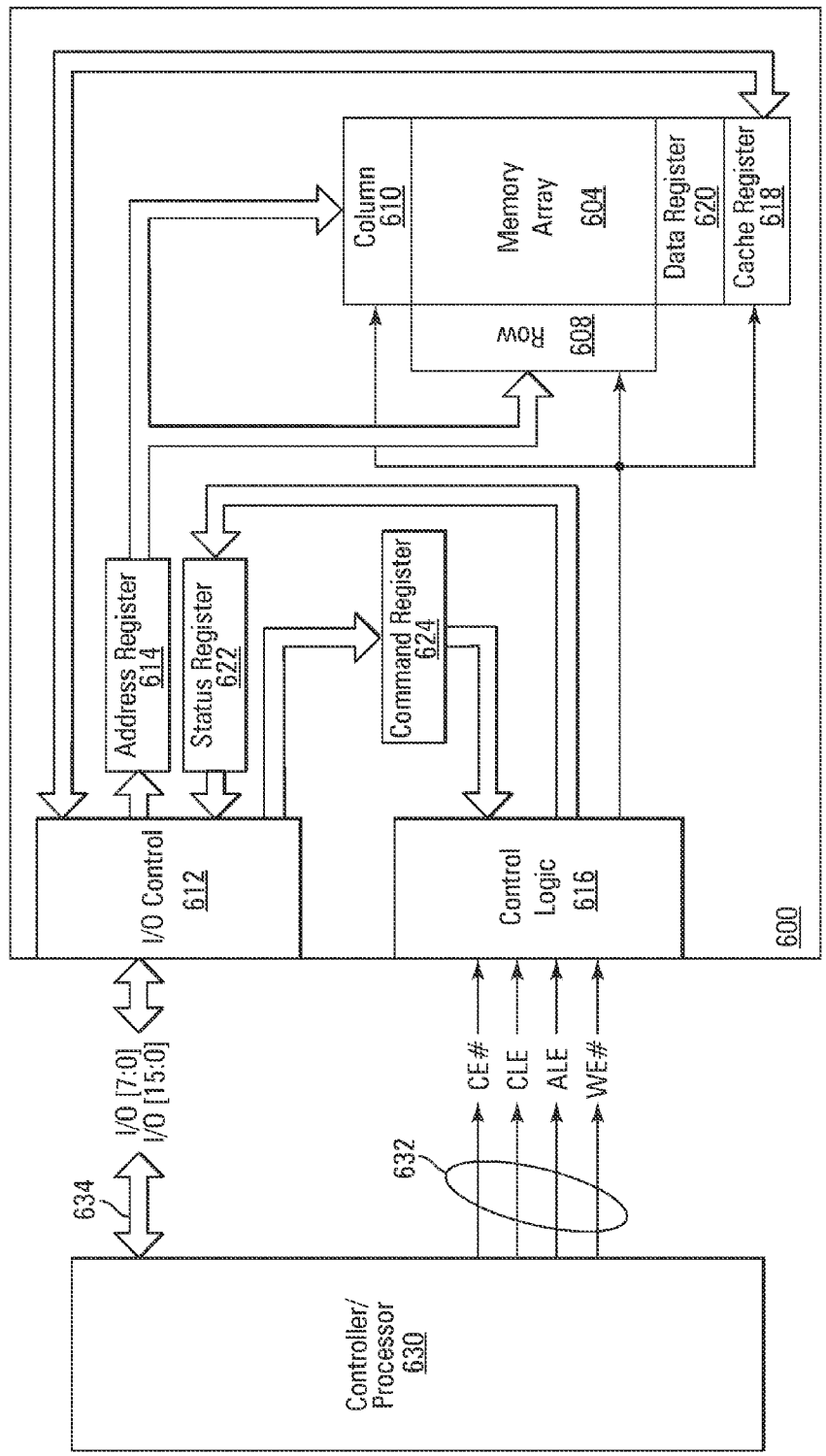
FIG. 6 is a simplified block diagram of an electronic system, according to an embodiment.

FIG. 6 is a simplified block diagram of an electronic device, e.g., an integrated circuit device, such a memory device 600, in communication with a controller 630, such as a memory controller, e.g. a host controller, as part of an electronic system, according to an embodiment. Memory device 600 might be a NAND flash memory device, for example.

Controller 630 might include a processor, for example. Controller 630 might be coupled to host, for example, and may receive command signals (or commands), address signals (or addresses), and data signals (or data) from the host and may output data to the host.

Memory device 600 includes an array of memory cells 604. Memory array 604 may be a stacked memory array, e.g., often referred to as three-dimensional memory array. Transistors, such as transistors 100, e.g., in FIGS. 3-5, might be coupled to access lines and/or control lines in memory array 604. For example, a plurality of transistors 100, such as the arrays of transistors 100 in FIGS. 3-5, might be located under memory array 604.

For example an array of transistors, e.g., located under memory array 604, might include a first line that might be coupled to a first transistor, where the first line might extend over a second transistor that might be successively adjacent to the first transistor and over a third transistor that might be successively adjacent to the second transistor. A second line might be coupled to the second transistor and might extend over the third transistor. One or more first dummy lines might be coupled to the first line and might extend from the first transistor to the second transistor. One or more second dummy lines might be coupled to the second line and might extend from the second transistor to the third transistor. A collective width of the one or more first dummy lines might be greater than a collective width of the one or more second dummy lines.

A row decoder 608 and a column decoder 610 might be provided to decode address signals. Address signals are received and decoded to access memory array 604.

Memory device 600 may also include input/output (I/O) control circuitry 612 to manage input of commands, addresses, and data to the memory device 600 as well as output of data and status information from the memory device 600. An address register 614 is in communication with I/O control circuitry 612, row decoder 608, and column decoder 610 to latch the address signals prior to decoding. A command register 624 is in communication with I/O control circuitry 612 and control logic 616 to latch incoming commands. Control logic 616 controls access to the memory array 604 in response to the commands and generates status information for the external controller 630. The control logic 616 is in communication with row decoder 608 and column decoder 610 to control the row decoder 608 and column decoder 610 in response to the addresses.

Control logic 616 can be included in controller 630, for example. Controller 630 can include other circuitry, firmware, software, or the like, whether alone or in combination. Controller 630 can be an external controller (e.g., in a separate die from the memory array 604, whether wholly or in part) or an internal controller (e.g., included in a same die as the memory array 604).

Control logic 616 is also in communication with a cache register 618. Cache register 618 latches data, either incoming or outgoing, as directed by control logic 616 to temporarily store data while the memory array 604 is busy writing or reading, respectively, other data.

During a write operation, data is passed from the cache register 618 to data register 620 for transfer to the memory array 604; then new data is latched in the cache register 618 from the I/O control circuitry 612. During a read operation, data is passed from the cache register 618 to the I/O control circuitry 612 for output to controller 630 and subsequent output to a host; then new data is passed from the data register 620 to the cache register 618. A status register 622 is in communication with I/O control circuitry 612 and control logic 616 to latch the status information for output to the controller 630.

Memory device 600 receives control signals at control logic 616 from controller 630 over a control link 632. The control signals may include at least a chip enable CE#, a command latch enable CLE, an address latch enable ALE, and a write enable WE#. Memory device 600 receives command signals (which represent commands), address signals (which represent addresses), and data signals (which represent data) from controller 630 over a multiplexed input/output (I/O) bus 634 and outputs data to controller 630 over I/O bus 634.

For example, the commands are received over input/output (I/O) pins [7:0] of I/O bus 634 at I/O control circuitry 612 and are written into command register 624. The addresses are received over input/output (I/O) pins [7:0] of bus 634 at I/O control circuitry 612 and are written into address register 614. The data are received over input/output (I/O) pins [7:0] for an 8-bit device or input/output (I/O) pins [15:0] for a 16-bit device at I/O control circuitry 612 and are written into cache register 618. The data are subsequently written into data register 620 for programming memory array 604. For another embodiment, cache register 618 may be omitted, and the data are written directly into data register 620. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 6 has been simplified. It should be recognized that the functionality of the various block components described with reference to FIG. 6 may not necessarily be segregated to distinct components or component portions of an integrated circuit device. For example, a single component or component portion of an integrated circuit device could be adapted to perform the functionality of more than one block component of FIG. 6. Alternatively, one or more components or component portions of an integrated circuit device could be combined to perform the functionality of a single block component of FIG. 6.

Additionally, while specific I/O pins are described in accordance with popular conventions for receipt and output of the various signals, it is noted that other combinations or numbers of I/O pins may be used in the various embodiments.

Figure 7:
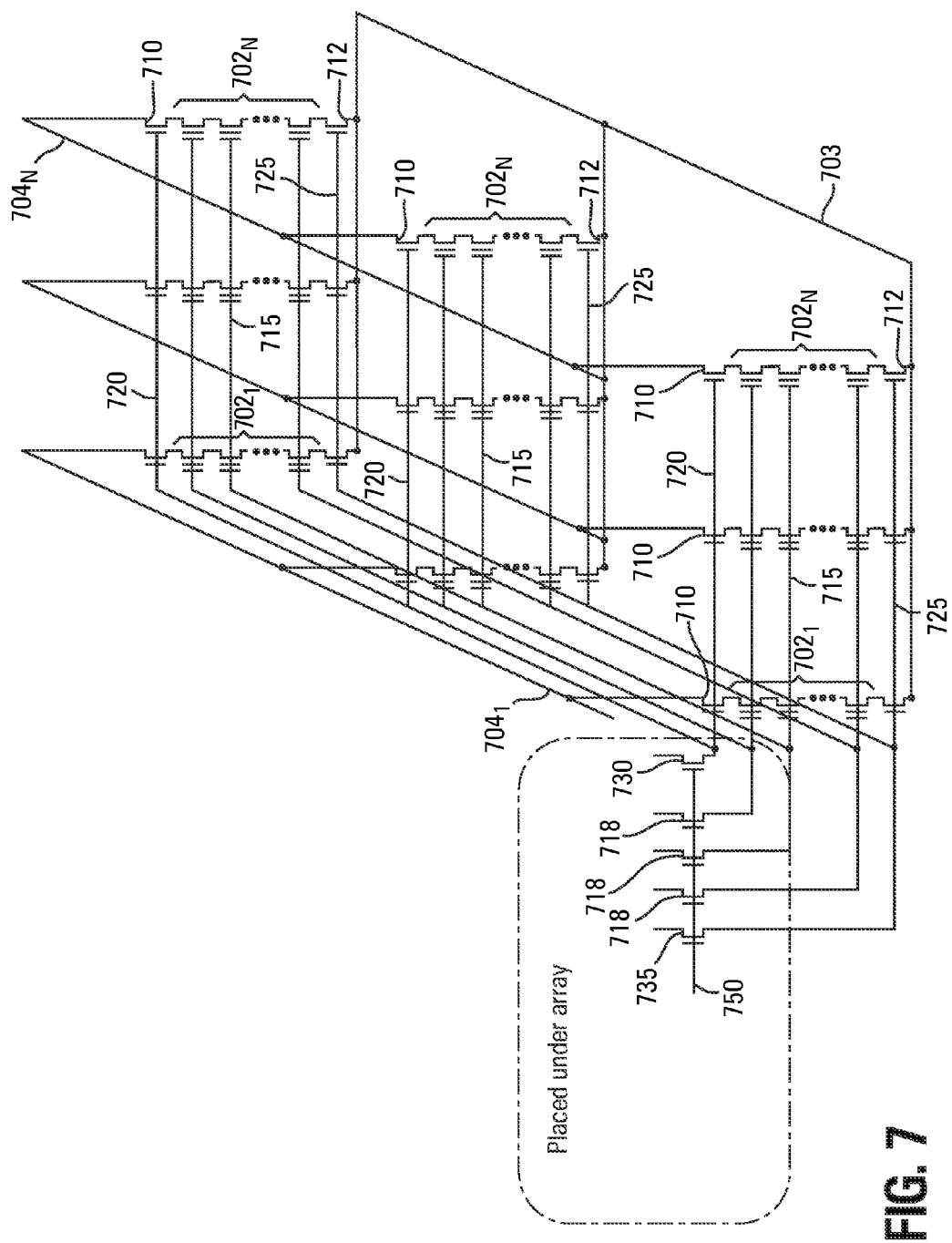
FIG. 7 is a schematic representation of a portion of a stacked memory array, according to an embodiment.

FIG. 7 is a schematic representation of an example of a portion of a stacked (e.g., a three-dimensional) memory array, such as a portion of memory array 604. In FIG. 7, vertical strings 702 (e.g., NAND strings) of series-coupled memory cells may be coupled between a source 703 and a data line, such as a bit line 704. For example, vertical strings $702_1$ to $702_N$ may be respectively coupled between source 703 and bit lines $704_1$ to $704_N$.

A select transistor 710, such as a drain select transistor, may be coupled between a respective string 702 and a respective bit line 704, and may be configured to selectively couple the respective string 702 to the respective bit line 704. A select transistor 712, such as a source select transistor, may be coupled between a respective string 702 and the source 703, and may be configured to selectively couple the respective string 702 to the source 703.

Memory cells at a common vertical level within the strings 702 might be commonly coupled to a respective one of a plurality of access lines (e.g., word lines). For example, the memory cells at one vertical level might be commonly coupled to a word line 715. The word lines 715, for example, might be commonly coupled to a transistor 718. For example, a transistor 718 may be configured to selectively couple the commonly coupled word lines 715 to a voltage source.

Select transistors 710 may be commonly coupled to select lines 720, such as drain select lines, and select transistors 712 may be commonly coupled to select lines 725, such as source select lines. Select lines 720 might be commonly coupled to a transistor 730. For example, transistor 730 may be configured to selectively couple the commonly coupled select lines 720 to a voltage source. Select lines 725 might be commonly coupled to a transistor 735. For example, transistor 735 may be configured to selectively couple the commonly coupled select lines 725 to a voltage source.

Transistors 718, 730, and 735 might be configured as the transistors 100 described above in conjunction with FIGS. 3-5 and might be commonly coupled to a control line 750 that may be configured as the control lines 110 described above in conjunction with FIGS. 3-5. For example, transistors 718, 730, and 735 might be in an array of transistors, such as the arrays of transistors 100 in FIGS. 3, 4A, 4B, and 5, e.g., having the dummy runners described above in conjunction with FIGS. 3, 4A, 4B, 4C, and 5. For some embodiments, transistors 718, 730, and 735 may be under the array shown in FIG. 7.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. An array of transistors, comprising:
   a first line coupled to a first transistor, the first line extending over a second transistor that is successively adjacent to the first transistor and over a third transistor that is successively adjacent to the second transistor;
   a second line coupled to the second transistor and extending over the third transistor;
   one or more first dummy lines coupled to the first line and extending from the first transistor to the second transistor; and
   one or more second dummy lines coupled to the second line and extending from the second transistor to the third transistor;
   wherein a collective width of the one or more first dummy lines is greater than a collective width of the one or more second dummy lines.

2. The array of transistors of claim 1, wherein the one or more first dummy lines comprise only a single first dummy line and the one or more second dummy lines comprise only a single second dummy line, and wherein the collective width of the one or more first dummy lines comprises a width of the first dummy line and the collective width of the one or more second dummy lines comprises a width of the second dummy line.

3. The array of transistors of claim 1, wherein the first, second, and third transistors are commonly coupled to a control line.

4. The array of transistors of claim 3, wherein the collective width of the one or more first dummy lines and the collective width of the one or more second dummy lines is in a direction perpendicular to the control line.

5. The array of transistors of claim 1, wherein the collective width of the one or more first dummy lines being greater than the collective width of the one or more second dummy lines comprises the one or more first dummy lines comprising two or more first dummy lines and the two or more first dummy lines comprising more dummy lines than the one or more second dummy lines.

6. The array of transistors of claim 5, wherein the two or more first dummy lines comprise one more dummy line than the one or more second dummy lines.

7. The array of transistors of claim 1, wherein the one or more first dummy lines are electrically isolated from the second and third transistors and the one or more second dummy lines are electrically isolated from the first and third transistors.

8. The array of transistors of claim 1, wherein the one or more first dummy lines are parallel to at least a portion of each of the first and second lines and the one or more second dummy lines are parallel to at least a portion of each of the first and second lines.

9. The array of transistors of claim 1, wherein the one or more first dummy lines terminate at the second transistor and the one or more second dummy lines terminate at the third transistor.

10. The array of transistors of claim 1, wherein the array of transistors is under a stacked memory array.

11. The array of transistors of claim 1, wherein the first and second transistors are configured to selectively couple a voltage source to access lines in a memory array that are coupled to the first and second lines.

12. The array of transistors of claim 1, wherein the first line is coupled to a source/drain of the first transistor and the second line is coupled to a source/drain of the second transistor.

13. The array of transistors of claim 1, wherein one of the one or more first dummy lines is immediately adjacent to the first line and is aligned with the second line.

14. The array of transistors of claim 1, wherein the one or more first dummy lines comprise a plurality of first dummy lines and the one or more second dummy lines comprise a plurality of second dummy lines, and wherein a distance comprising the collective width of the plurality of first dummy lines and a collective width of spaces between the plurality of first dummy lines is greater than a distance comprising the collective width of the plurality of second dummy lines and a collective width of spaces between the plurality of second dummy lines.

15. The array of transistors of claim 1, wherein the first, second, and third transistors are double-gate transistors.

16. An array of transistors, comprising:
a plurality of successively adjacent transistors commonly coupled to a control line, each of the plurality of successively adjacent transistors coupled to a respective runner by a respective line that is transverse to its respective runner, the respective runners being successively adjacent to each other; and
different numbers of dummy runners respectively between different respective pairs of the respective lines, the respective lines of each of the different respective pairs respectively coupled to successively adjacent transistors of a respective pair of successively adjacent transistors;
wherein the number of dummy runners between each pair of the different respective pairs of the respective lines is coupled to one of the respective lines of that respective pair and is electrically isolated from the other one of the respective lines of that respective pair.

17. The array of transistors of claim 16, wherein the different numbers of dummy runners respectively between the different respective pairs of the respective lines comprise a first number of dummy runners between a first pair of lines of the respective pairs of the respective lines respectively coupled to successively adjacent transistors of a first pair of successively adjacent transistors and a second number of dummy runners between a second pair of lines of the respective pairs of the respective lines respectively coupled to successively adjacent transistors of a second pair of successively adjacent transistors, wherein one of the respective lines of the first pair of lines and one of the respective lines of the second pair of lines is a same line common to first and second pairs of lines.

18. The array of transistors of claim 17, wherein the first number of dummy runners is one dummy runner greater than the second number of dummy runners.

19. The array of transistors of claim 18, wherein the first number of dummy runners is electrically isolated from the same line common to the first and second pairs of lines and the second number of dummy runners is coupled to the same line common to the first and second pairs of lines.

20. The array of transistors of claim 19, wherein the respective runner that is coupled to the same line common to the first and second pairs of lines is aligned with one of the dummy runners of the first number of dummy runners.

21. An array of transistors, comprising:
a first line comprising a first portion coupled to a source/drain of a first transistor and a second portion that extends from the first transistor and over a second transistor that is successively adjacent to the first transistor and over a third transistor that is successively adjacent to the second transistor;
a second line comprising a first portion coupled to a source/drain of the second transistor and a second portion adjacent and parallel to the second portion of the first line, the second portion of the second line extending from the second transistor and over the third transistor;
a third line comprising a first portion coupled to a source/drain of the third transistor and a second portion adjacent and parallel to the second portion of the second line;
a first number of dummy lines between the first portions of the first and second lines and coupled to the first portion of the first line; and
a second number dummy lines between the first portions of the second and third lines and coupled to the first portion of the second line;
wherein the first number is greater than the second number.

22. The array of transistors of claim 21, wherein the first number of dummy lines between the first portions of the first and second lines is electrically isolated from the first portion of the second line and the second number dummy lines between the first portions of the second and third lines is electrically isolated from the first portion of the third line.

23. The array of transistors of claim 21, wherein the first portions of the first, second, and third lines are perpendicular to the second portions of the first, second, and third lines.

24. The array of transistors of claim 21, wherein the first number of dummy lines is one dummy line greater than the second number of dummy lines.

25. The array of transistors of claim 24, wherein the first number of dummy lines and the second number dummy lines have the same pitch as the first, second and third lines.

* * * * *